United States Patent [19]
Pfirsch

[11] Patent Number: 5,455,434
[45] Date of Patent: Oct. 3, 1995

[54] THYRISTOR WITH BREAKDOWN REGION

[75] Inventor: Frank Pfirsch, München, Germany

[73] Assignee: Siemens Aktiengesellschaft, Munich, Germany

[21] Appl. No.: 286,987

[22] Filed: Aug. 8, 1994

Related U.S. Application Data

[63] Continuation of Ser. No. 59,492, May 10, 1993, abandoned.

[30] Foreign Application Priority Data

May 11, 1992 [DE] Germany .................. 42 15 378.6

[51] Int. Cl.⁶ .................. H01L 29/74; H01L 29/743; H01L 29/747
[52] U.S. Cl. .................. 257/168; 257/169; 257/113; 257/129; 257/153; 257/166
[58] Field of Search .................. 257/152, 153, 257/113, 114, 115, 116, 147, 150, 151, 157, 169 170, 171

[56] References Cited

U.S. PATENT DOCUMENTS 5,083,177  1/1992  Tuerkes et al. .................. 257/115

FOREIGN PATENT DOCUMENTS 0125138  11/1984  European Pat. Off. .
3225991  7/1989  Germany .
3225991  7/1989  Germany .
55-111168  8/1980  Japan .................. 257/170
0284856  11/1988  Japan .................. 257/153

OTHER PUBLICATIONS

Lowry et al; "Light Activated Semiconductor Switchies", 17/1977; IEEE 1977 National Aerospace and Electronics Conference; pp. 616–622.

Publication: IPEO–Tokyo '83 (Ohashi et al) pp. 550–558 "Design Consideration for High–Power Overvoltage Self–Protected Thyristor".

*Primary Examiner*—Rolf Hille
*Assistant Examiner*—Wael M. Fahmy
*Attorney, Agent, or Firm*—Herbert L. Lerner; Laurence A. Greenberg

[57] ABSTRACT

A thyristor includes a semiconductor body with a surface. The semiconductor body has an inner zone of a first conduction type; a cathode-side base zone of a second conduction type opposite the first type, the base zone having a recess formed therein; a layer of the second conduction type being disposed on the surface of the semiconductor body, being disposed in the cathode-side base zone, being thinner than the cathode-side base zone, and being joined to the cathode-side base zone; and an additional zone of the second conduction type being disposed in the recess, being joined to the layer, being thicker than the layer, and being spaced apart from the cathode-side base zone.

9 Claims, 2 Drawing Sheets

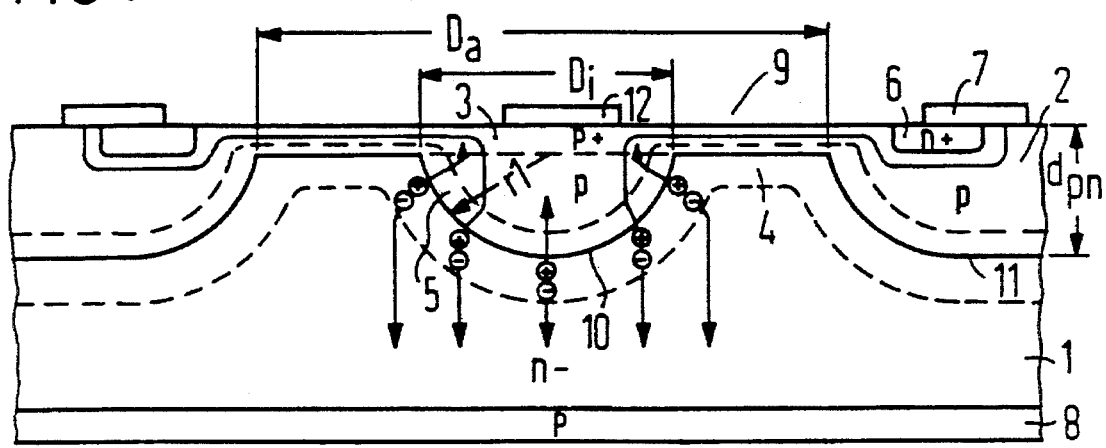
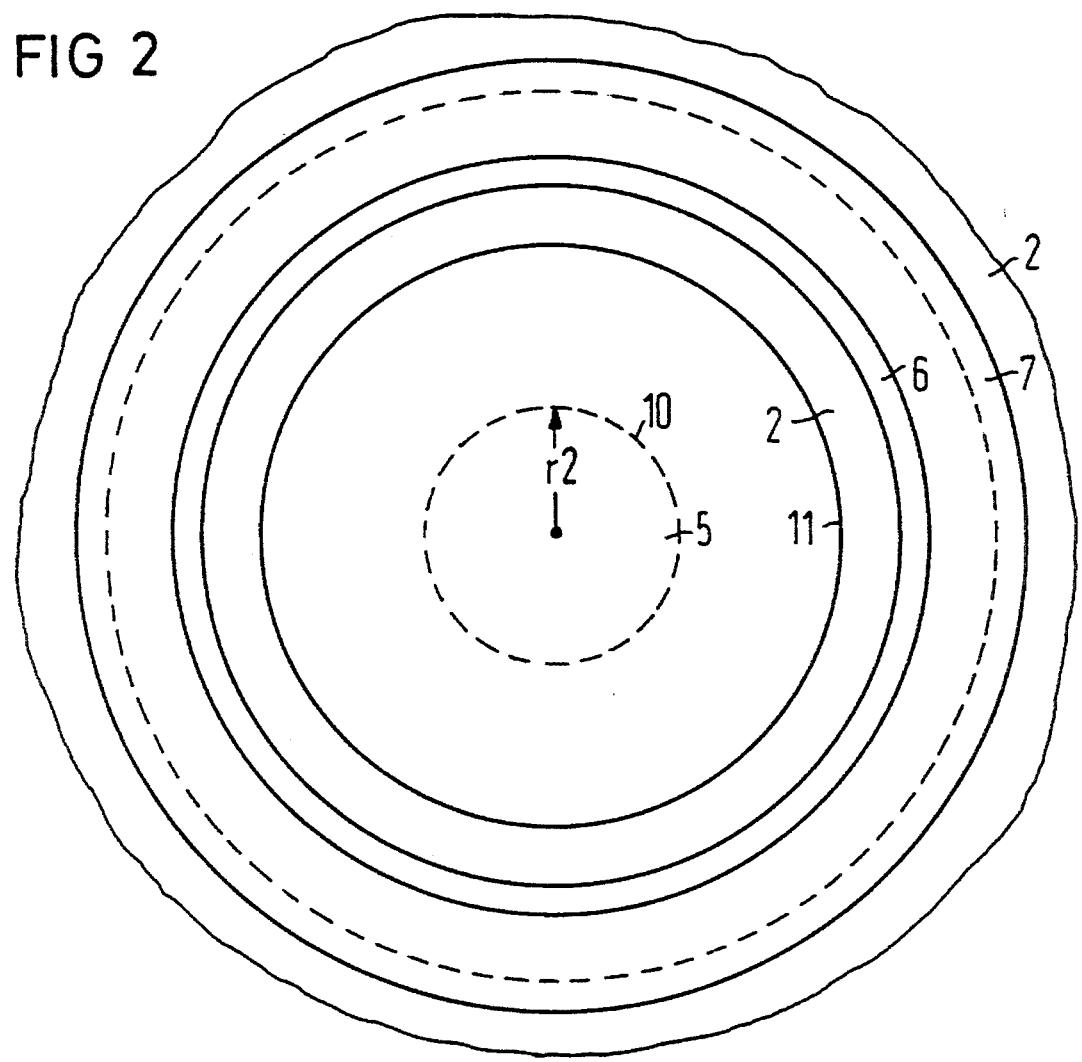

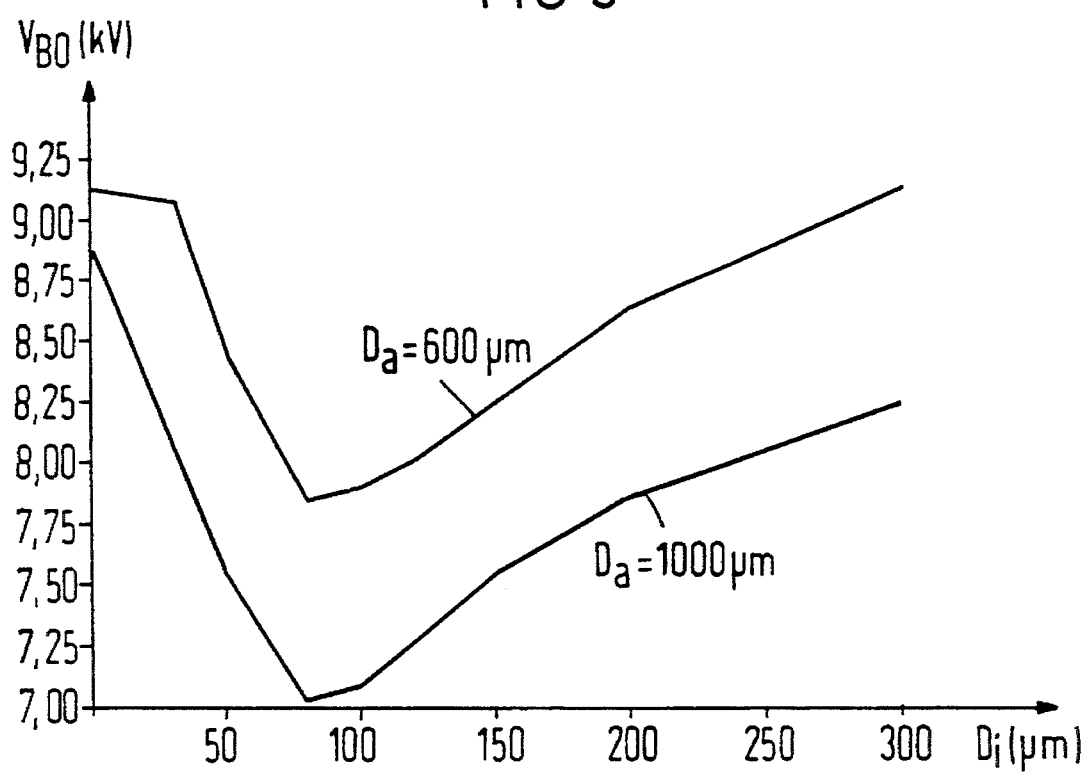

ated May 10, 1993 now abandoned.

THYRISTOR WITH BREAKDOWN REGION

This application is a continuation, of application Ser. No. 08/059,492, filed May 10, 1993 now abandoned.

SPECIFICATION

The invention relates to a thyristor having a semiconductor body with an inner zone of a first conduction type, a base zone on the cathode side of an opposite second conduction type, and a recess in the base zone inside which a layer being thinner than the base zone and having the second conduction type is disposed on the surface of the semiconductor body, the layer being joined to the base zone on the cathode side.

In high-voltage systems, a plurality of thyristors are generally connected in series. They must always be fired simultaneously. If one of the thyristors fires later, then virtually all of the voltage is applied to it, and the thyristor is destroyed. Efforts are therefore directed to developing thyristors that can be turned on without gate current. As a rule, such thyristors have a central region that has a lower breakdown voltage as compared with the remaining region and the edge. If the voltage at the thyristor increases, then this region enters the state of avalanche breakdown and the breakdown current can fire the thyristor directly or through one or more auxiliary thyristor structures.

The breakdown region may be created, for instance, by making a recess in the base zone on the cathode side, with a thinner layer of the same conductivity type being disposed inside the recess on the surface of the semiconductor body. The pn junction between the base zone on the cathode side and the inner zone then has a defined radius of curvature at the transition from the horizontal to the recess, at which a higher field intensity occurs than at a flat pn junction. A breakdown of the thyristor therefore preferentially occurs at the curvature. By way of example, such a structure has been described in the article entitled "Design Consideration for High-Power, Overvoltage Self-Protected Thyristor" by Ohashi, Yoshida, Yamaguchi, Akagi, published in IPEC-Tokyo '83, pp. 550–558, particularly in conjunction with FIG. 1B.

The breakdown properties of the aforementioned region depend on the shape of the pn junction of the base zone on the cathode side. Moreover, the field intensity increase that results from the aforementioned defined radius of curvature has a field intensity decrease superimposed on it, which is dictated by the cylindrical shape of the recess and by the thin surface layer. The aforementioned region of reduced breakdown voltage is therefore effective only at a high penetration depth of the base zone on the cathode side. If the thin surface layer is omitted, then the effectiveness of the region does increase. However, the breakdown voltage is then strongly dependent on surface changes and therefore on the way in which the process is carried out, and is therefore not very replicable.

It is accordingly an object of the invention to provide a thyristor with a breakdown region, which overcomes the hereinafore-mentioned disadvantages of the heretofore-known devices of this general type and which does so in such a way that the region of reduced breakdown voltage is more replicable and more effective.

With the foregoing and other objects in view there is provided, in accordance with the invention, a thyristor, comprising a semiconductor body with a surface, the semiconductor body having an inner zone of a first conduction type; a cathode-side base zone of a second conduction type opposite the first type, the base zone having a recess formed therein; a layer of the second conduction type being disposed on the surface of the semiconductor body, being disposed in the cathode-side base zone, being thinner than the cathode-side base zone, and being joined to the cathode-side base zone; and an additional zone of the second conduction type being disposed in the recess, being joined to the layer, being thicker than the layer, and being spaced apart from the cathode-side base zone.

In accordance with another feature of the invention, the additional zone and the recess are constructed circularly in the plane of the surface, and the additional zone is disposed concentrically in the recess.

In accordance with a further feature of the invention, the diameter of the additional zone is smaller than half the diameter of the recess.

In accordance with an added feature of the invention, the additional zone has the same depth as the cathode-side base zone.

In accordance with an additional feature of the invention, the additional zone has a pn junction, and the additional zone has a diameter being larger than half the depth of the pn junction of the additional zone.

In accordance with yet another feature of the invention, there is provided a light-sensitive region for controlling the thyristor with light, the additional zone and the layer being disposed in the light-sensitive region.

In accordance with yet a further feature of the invention, there is provided an auxiliary emitter zone surrounding the light-sensitive region.

In accordance with yet an added feature of the invention, there is provided a gate electrode providing the layer with electrical contact.

In accordance with a concomitant feature of the invention, the layer has a higher doping than the additional zone and the base zone.

Other features which are considered as characteristic for the invention are set forth in the appended claims.

Although the invention is illustrated and described herein as embodied in a thyristor with a breakdown region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIGS. 1 and 2 are respective fragmentary, diagrammatic, sectional and plan views of a thyristor according to the invention; and FIG. 3 is a diagram illustrating a relationship between a breakdown voltage $V_{BO}$ and a diameter $D_i$ of an additional zone, with a diameter $D_a$ of a recess as a parameter.

Referring now to the figures of the drawing in detail and first, particularly, to FIGS. 1 and 2 thereof, there is seen a thyristor which has a weakly n-doped inner zone 1. The inner zone 1 is adjoined by a p-doped base zone 2 on the cathode side. The base zone 2 has a recess 4. Seated in the recess 4 is a layer 3, which has the same conduction type as the base zone 2. The layer 3 extends as far as the surface of the cathode side. Preferably, the layer 3 is more highly doped than the zone 2. An additional zone 5, which has the same conduction type as the cathode-side base zone 2, is also disposed in a recess 4. The additional zone 5 is joined to the layer 3 and is spaced apart on all sides from the edge of the recess 4 or in other words from the base zone 2.

Embedded in the base zone 2 is an emitter zone 6 which may, for example, be the auxiliary emitter zone of an auxiliary thyristor. The emitter zone 6 is provided with electrical contact by means of an auxiliary emitter electrode 7. On the outside, the auxiliary electrode 7 also provides electrical contact for the base zone 2.

As is shown in FIG. 2, the recess 4, the layer 3, the additional zone 5, the auxiliary emitter zone 6 and the electrode 7 may be constructed circularly or annularly and be disposed concentrically to one another. As is also shown in FIG. 2, a pn junction 10 between the additional zone 5 and the inner zone 1 therefore has a radius r2 in the plane of the surface of the thyristor. As is shown in FIG. 1, the additional zone 5 may have the shape of a spherical dome with a radius r1 in a plane at right angles to the thyristor.

However, the illustrated shape of the additional zone 5 is not compulsory. It may also take the form of a typical diffusion well and have the shape of a polygon as seen in a plan view, for example. However, it is essential that the additional zone 5 be at least partially convex, as viewed from the inner zone 1. Suitably, the zone 5 is produced simultaneously with the cathode-side base zone 2, for example by implanting a thin layer and then hammering or driving it in. By way of example, the layer 3 may also be also produced by implantation and hammering or driving in.

The shape of the recess 4, the zone 6 and the electrode 7 may also deviate from the circular or circular-annular form and may be shaped polygonally, as an example.

In the case of an approximately 8 kV thyristor, a basic doping of the inner zone 1 of approximately $1 \times 10^{13}/cm^3$ was established. The cathode-side base zone 2 may have a peripheral doping higher than $10^{16}/cm^3$. The zone 3 is produced with a dose higher than $10^{12}/cm^2$, for example, with ensuing hammering or driving in to a thickness of 5 m, for instance. Depths $d_{pn}$ of the pn junction 10 of the additional zone 5 and of a pn junction 11 of the base zone 2, are greater than 40 m.

In FIG. 3, a relationship between a breakdown voltage $V_{BO}$ and a diameter $D_i$ of the additional zone 5 is shown. It can be seen that for various diameters $D_a$ of the recess 4, the breakdown voltage is at a minimum at a diameter $D_i$ of approximately 80 m, for example. A reduction is generally already achieved if the diameter $D_i$ is less than half the diameter $D_a$.

The lower limit of $D_i$ is approximately 1/10 to 1/20 the diameter $D_a$, since if the diameter $D_i$ decreases further, the breakdown voltage increases again. It has also proved suitable for the diameter $D_i$ of the additional zone to be greater than half the depth $d_{pn}$ of the pn junction of the additional zone.

FIG. 1 shows that if a voltage in the forward direction is applied preferentially in the region of the additional zone 5, pairs of charge carriers form, from which the electrons move toward an anode-side emitter zone 8 and the holes move toward the layer 3 and then underneath the auxiliary emitter zone 6 to the auxiliary emitter electrode 7. This current increases in avalanche-like fashion and in a known manner initiates the firing of the auxiliary thyristor and therefore of the entire thyristor.

The purpose of the layer 3 is to protect the cathode-side surface of the thyristor against surface charges. To that end, as already mentioned, it is more highly doped than the additional zone 5 and the base zone 2.

The thyristor may be light-controllable. It has a light-sensitive region 9 which encompasses the layer 3 and the zone 5, and optionally a region of the base zone 2 adjoining the layer 3 as well. However, the invention can also be employed with current-controlled thyristors. In that case, the layer 3 or the base of one of the auxiliary thyristors mentioned initially at the outset is provided with electrical contact by means of a gate electrode 12.

I claim:

1. A thyristor, comprising:

a semiconductor body having a surface;

an inner zone of a first conduction type;

a cathode-side base zone of a second conduction type opposite the first conduction type and adjoining said surface;

said base zone having an annularly formed first part extending to a first predetermined depth and adjoining said surface;

said base zone having a second part arranged within said annularly formed first part of said base zone and adjoining said first part and said surface;

said second part extending to a second depth less than the first depth;

said base zone having a third part disposed within said first annularly formed part of said base zone and extending to a depth greater than the second depth;

said third part adjoining said second part.

2. The thyristor according to claim 1, wherein said third part of said base zone is circularly formed and has an outer diameter; said first part of said base zone is circularly formed and has an inner diameter; and the third part is concentrically disposed within said first part.

3. The thyristor according to claim 2, wherein the outer diameter of said third part is smaller than half the inner diameter of said first part.

4. The thyristor according to claim 1, wherein said third part extends to the same depth as said first part.

5. The thyristor according to claim 3, wherein said third part has a pn junction, and said third part has a diameter larger than half the depth of said pn junction of said third part.

6. The thyristor according to claim 1, including a light-sensitive region for controlling the thyristor with light, said third part and said second part being disposed in said light-sensitive region.

7. The thyristor according to claim 6, including an auxiliary emitter zone surrounding said light-sensitive region.

8. The thyristor according to claim 1, including a gate electrode providing said second part with an electrical contact.

9. The thyristor according to claim 1, wherein said second part has a higher doping concentration than said third part and said first part.

* * * * *